United States Patent [19]

Lampert

[11] Patent Number: 4,724,171
[45] Date of Patent: Feb. 9, 1988

[54] PROCESS FOR PROTECTING POLISHED SILICON SURFACES

[75] Inventor: Ingolf Lampert, Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 923,133

[22] Filed: Oct. 24, 1986

[30] Foreign Application Priority Data

Nov. 14, 1985 [DE] Fed. Rep. of Germany ....... 3540469

[51] Int. Cl.$^4$ .............................................. B05D 3/00
[52] U.S. Cl. .................................... 427/299; 427/301; 427/387
[58] Field of Search .................. 427/299, 301, 387, 93

[56] References Cited

U.S. PATENT DOCUMENTS

| 4,562,091 | 12/1985 | Sachdev et al. | 427/41 |
| 4,584,205 | 4/1986 | Chen et al. | 427/93 |
| 4,606,935 | 8/1986 | Blum | 427/93 |
| 4,678,688 | 7/1987 | Itoh et al. | 427/387 |

Primary Examiner—Thurman K. Page
Assistant Examiner—Leon R. Horne
Attorney, Agent, or Firm—Collard, Roe & Galgano

[57] ABSTRACT

In a process for protecting polished silicon surfaces, after an oxidative cleaning is carried out, the surface is coated with a protective layer by the action of a reagent especially hexamethyldisilazane which permits trialkylsilylation. The layer prevents aging of the oxide layer even over several months storage. Before subsequent processing steps, the protective layer can easily be removed again by thermal oxidation, without forming interfering by-products.

8 Claims, No Drawings

PROCESS FOR PROTECTING POLISHED SILICON SURFACES

The invention relates to a process for protecting polished silicon surfaces.

In the case of silicon wafers, the perfect surface produced during the polishing process (which process may, for example, be carried out in accordance with U.S. Pat. No. 4,270,316) is exposed, even immediately after completion of the polishing process, to a plethora of potentially adverse effects. These effects are produced, for example, by wash solutions, water, or the surrounding atmosphere, and they can influence the surface quality.

It is known to further treat the wafer surface by subjecting the silicon wafer to an oxidative cleaning after the polishing process. In this treatment, which is generally carried out in a known manner (compare, for example, W. Kern and D. Puotinen, RCA Review, June 1970, pages 187-206), e.g., by immersion in a hydrogen peroxide/ammonia solution, the polished surface becomes coated with a thin layer of partially hydrated silicon dioxide. Even during prolonged storage of the wafer, this layer, as a rule, prevents contamination of the surface by carbon compounds, for example, hydrocarbons, which are present in the surrounding atmosphere. However, the structure of the protective layer also changes due to aging effects, especially with prolonged storage. Such changes can, after a subsequent thermal oxidation step (for example, at 1000° C. in dry oxygen), cause veil-like clouding on the polished surface. This clouding is referred to as haze and it becomes visible as diffuse surface reflections, for example, on examining the wafer surface under a sharply focussed intense light beam.

Accordingly, it is an object of the present invention to provide a process which ensures reliable, long-lasting, reproducible protection of polished, oxidatively cleaned silicon surfaces, especially in connection with the thermal oxidation steps required in the course of the manufacture of electronic components.

SUMMARY OF THE INVENTION

The foregoing and related objects are readily achieved by a process wherein, following the oxidative cleaning carried out in a manner known, per se, the silicon surface is subjected to the action of a reagent suitable for trialkylsilylation.

DETAILED DESCRIPTION OF THE PREFERRED EMBODIMENT

For application of the oxide layer, the above-mentioned process is particularly suitable, and it is extensively used for the aftertreatment of polished silicon wafers. The wafers, after having been polished and after removal of the polishing residues, are briefly immersed in an aqueous ammoniacal hydrogen peroxide solution (compare, for example, W. Kern and D. Puotinen, Loc. cit. or W. Kern, Semiconductor International, April 1984, pages 94-99). It is true that, in principle, other methods of oxidation, for example, by means of sodium hypochlorite solution or anodic oxidation in alkaline solution, may be used. However, with these methods there primarily is the danger of contaminating the wafer surface with interfering cations.

Following the oxidative treatment, the polished silicon wafers are advantageously washed and dried and are then available for the next treatment step, in which the polished silicon surface is subjected to the action of a reagent suitable for trialkylsilylation. Advantageously, this treatment is carried out as far as possible directly following the oxidative cleaning, although experience has shown that delay times of up to about 10 hours can be tolerated.

Suitable reagents are, in particular, hexaalkyldisilazanes, preferably hexamethyldisilazane. The latter compound is a chemical which is frequently used as an adhesion promoter for photoresists in the production of electronic components. Its use would therefore also not be expected to cause any complications when employing the polished silicon wafer, treated according to the invention, in the manufacture of electronic components. A possible explanation of the action of the suitable compounds is that they presumably react with the OH groups present on the oxidized silicon surface, causing trialkylsilylation or trimethylsilylation, and thereby coat the surface with a thin protective film. At the same time, they eliminate the centers on which a process resembling the aging of silicic acids can take place by, for example, elimination of water between different Si-OH groups.

In principle, it is also possible to apply the selected reagent in liquid form, either directly or diluted with a solvent such as, e.g., trifluorotrichloroethane, onto the wafer surface, for example, by whirler coating. However, the process which is more advantageous and is preferred within the scope of the invention, even on purity grounds alone, is to allow the gaseous reagent to act on the silicon. This can take place, for example, in a reaction chamber into which an atmosphere containing the reagent in the desired concentration has first been introduced, and into which the silicon wafer can be brought for the time required to saturate the surface.

Advantageously, the working atmosphere is obtained by means of a carrier gas, which, for example, flows through the chamber, and to which a particular requisite amount of reagent is added, e.g., with the aid of a temperature controlled evaporator (bubbler). It is also possible to effect this introduction of reagent into a part-stream branched off of the total gas stream. The required amount is generally low. For example, in the case of the hexamethyldisilazane preferentially employed, the required amount is about 1 to 15 mg/liter of carrier gas. Higher amounts, up to saturation of the carrier gas, which in principle are possible, are usually not required.

Suitable carrier gases are primarily the inert gases conventionally used in silicon technology, for example, nitrogen, argon or Freons (polyhalogenated hydrocarbons containing fluorine and chlorine, e.g., $CF_2Cl_2$). However, when using air or other oxidizing gases (e.g., $O_2$) which, in principle, is also possible, the fact that the reagents suitable for alkylsilylation, such as hexamethyldisilazane, in most cases have substantial sensitivity to oxidation, must be considered.

The exposure time can usually be kept brief, i.e., in the range of a few minutes. For example, when using the preferred hexamethyldisilazane, complete saturation of the surface with trimethylsilyl groups is assured in most cases after exposing the wafers to the reagent for a residence time of about 0.2 to 5 minutes.

The wafers treated in this way are provided with a protective layer, which even upon storage for several months, prevents aging of the oxide layer applied by the oxidative cleaning.

In the manufacture of components, the trialkylsilyl groups of the protective layer can be removed by a thermal oxidation, which in any case is carried out at the start of most of the processes. In this oxidation, the alkyl groups combust to yield gaseous carbon dioxide and water and can escape via the gas phase. The layer of oxygen-saturated silicon which remains on the water surface is indistinguishable from the layers usually produced on silicon surfaces during oxidation processes, and accordingly it is not detrimental to the subsequent processing steps.

The process according to the invention accordingly offers the possibility of reliably protecting silicon surfaces, after an oxidative cleaning, against aging effects even after storage for several months. A particular advantage is that the reagents employed according to the invention, especially hexamethyldisilazane, can be simply applied without complex apparatus and under extremely pure conditions (gas phase), and it can also be removed again without leaving interfering residues.

The invention will now be explained more fully in an example which is, however, only given by way of illustration and not of limitation.

EXAMPLE 50 silicon wafers (diameter 10 cm, (100) orientation) were subjected to a polishing process in a commercial polishing machine under conventional conditions (alkaline $SiO_2$ sol., about 40° C.). The wafers were than taken out and subjected to an oxidative cleaning by immersion for about 15 minutes in a cleaning mixture (1 part of 30% strength by weight of $H_2O_2$, 1 part of concentrated $NH_3$, 6 parts of water) kept at about 85° C. The wafers were then rinsed with demineralized water and dried.

Immediately thereafter, a tray with 25 wafers was subjected to a treatment with hexamethyldisilazane. For this purpose, a treatment chamber was provided in which there was an argon atmosphere containing about 10 mg of hexamethyldisilazane/liter of argon. This working atmosphere was obtained by branching a part-stream off of an argon stream (about 100 liters/h) before the argon stream entered the chamber. The part-stream was passed through an evaporator (bubbler) charged with hexamethyldisilazane and thermostatically kept at 26° C., absorbed a corresponding proportion of hexamethyldisilazane vapor therein and was finally recombined with the residual argon stream in order to then pass through the treatment chamber. The flow rates of the part-streams and the evaporator temperature were balanced so as to assure the desired content of 10 mg of hexamethyldisilazane/liter of gas in the chamber. The tray with the wafers to be treated was then placed in the treatment chamber and removed again after an exposure time of about 1.5 minutes.

The 25 wafers thus treated, as well as the remaining 25 untreated wafers, were then left to stand for about 40 days in a wafer storage container which, though closed, was not hermetically sealed. The storage area conformed to the clean room conditions according to class 100 of U.S. Federal Standard 209 a.

Thereafter, all the wafers were subjected, under precisely identical conditions, to oxidation with dry oxygen at about 1000° C., for about 100 minutes duration, in the course of which an oxide layer about 700 Å thick was produced. To control the surface quality, the wafers were then examined under a sharply focussed intense light beam for any haze.

On all 25 untreated wafers, the diffuse surface reflections characteristic of haze were observable on the surface. In contrast, the 25 wafers treated in a manner according to the invention had an entirely perfect surface, so that no diffuse surface reflections were discernible.

Thus, while only a single embodiment and example of the present invention has been described, it is obvious that many changes and modifications may be made thereunto, without departing from the spirit and scope of the invention.

What is claimed is:

1. A process for protecting a polished silicon surface, comprising the steps of:
   treating the silicon surface with an oxidative cleaning solution,
   subsequently washing and drying said treated silicon surface; and
   subjecting the washed and dried silicon surface to the action of a reagent suitable for trialkylsilylation.

2. The process of claim 1, wherein the reagent comprises a hexaalkyldisilazane.

3. The process of claim 1, wherein the reagent comprises hexamethyldisilazane.

4. The process of claim 1, wherein the reagent is employed in the gaseous state.

5. The process of claim 3, further comprising the step of admixing the reagent with a carrier gas in a concentration of up to approximately 15 mg of reagent/liter of carrier gas.

6. The process of claim 1, wherein the silicon surface is subjected to the reagent for a period of approximately from 0.5 to 5 minutes.

7. The process of claim 1, further comprising the step of removing the layer produced on the silicon surface by the action of the reagent by thermal oxidation.

8. The process of claim 5, wherein the carrier gas is a member selected from the group consisting of argon, nitrogen, freon, air, oxygen, and a combination thereof.

* * * * *